[19] United States Patent
Exposito et al.

(10) Patent No.: US 6,893,169 B1
(45) Date of Patent: May 17, 2005

(54) OPTICAL SEMICONDUCTOR PACKAGE AND PROCESS FOR FABRICATING THE SAME

(75) Inventors: Juan Exposito, St. Nazaire les Eymes (FR); Remi Brechignac, Grenoble (FR)

(73) Assignee: STMicroelectronics S.A., Montrouge (FR)

(*) Notice: Subject to any disclaimer, the term of this patent is extended or adjusted under 35 U.S.C. 154(b) by 8 days.

(21) Appl. No.: 10/129,371
(22) PCT Filed: Oct. 30, 2000
(86) PCT No.: PCT/FR00/03023
§ 371 (c)(1), (2), (4) Date: Oct. 1, 2002
(87) PCT Pub. No.: WO01/33638
PCT Pub. Date: May 10, 2001

(30) Foreign Application Priority Data

Nov. 4, 1999 (FR) .......................... 99 13778

(51) Int. Cl.⁷ ................................. G02B 6/36
(52) U.S. Cl. ..................... 385/92; 385/93; 385/94; 385/73; 257/433; 257/99
(58) Field of Search ..................... 385/92, 93, 94, 385/73; 257/433, 99

(56) References Cited

U.S. PATENT DOCUMENTS 5,523,608 A * 6/1996 Kitaoka et al. ............. 257/433
5,973,337 A * 10/1999 Knapp et al. ................. 257/99
6,143,588 A * 11/2000 Glenn ......................... 438/116

* cited by examiner

Primary Examiner—Dean A. Reichard
Assistant Examiner—Jinhee Lee
(74) Attorney, Agent, or Firm—Lisa K. Jorgenson; Stephen Bongini; Fleit, Kain, Gibbons, Gutman, Bongini & Bianco P.L.

(57) ABSTRACT

A process is provided for fabricating an optical semiconductor package. According to the process, a first semiconductor component is fixed to a rear face of an electrical connection support plate, and this first component is electrically connected to the support plate. An encapsulation block for the first component is molded on the rear face of the support plate. A second semiconductor component, a front face of which has an optical sensor, is fixed to one face of the first component, and this second component is electrically connected to the support plate. The second component is encapsulated on the front face of the support plate. Also provided is an optical semiconductor package.

26 Claims, 5 Drawing Sheets

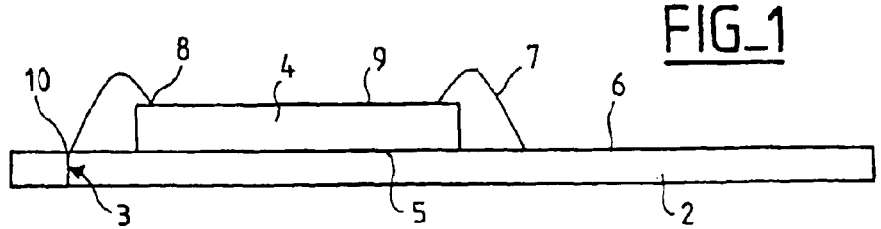
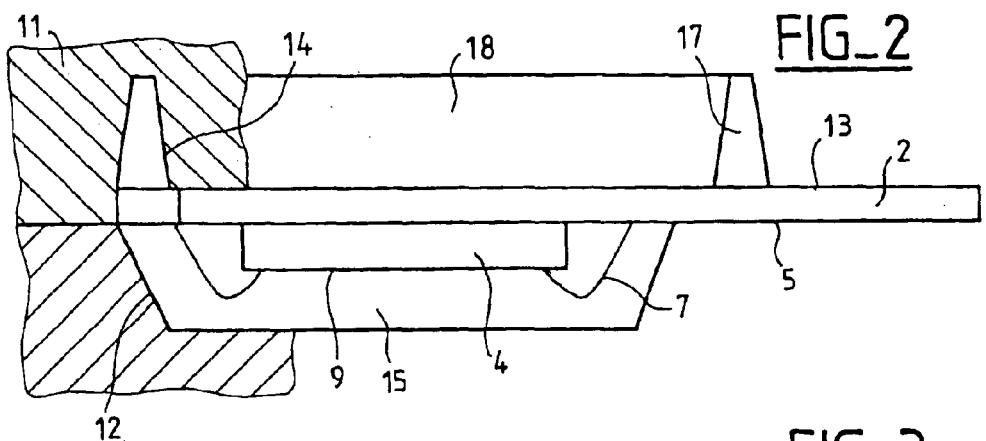
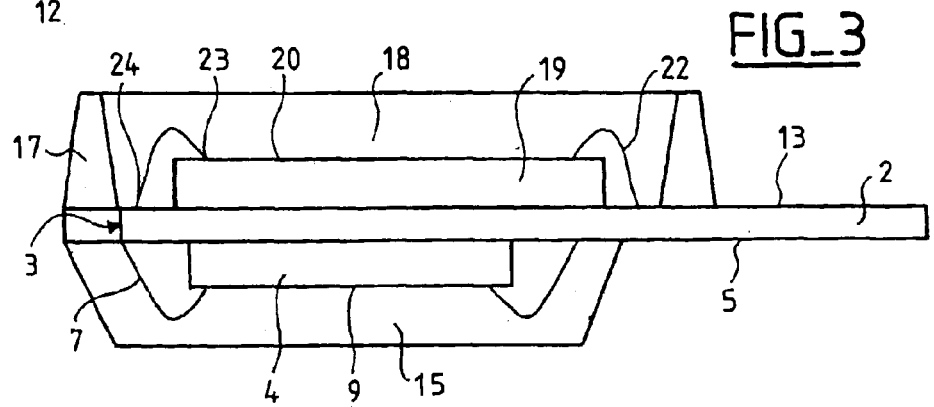
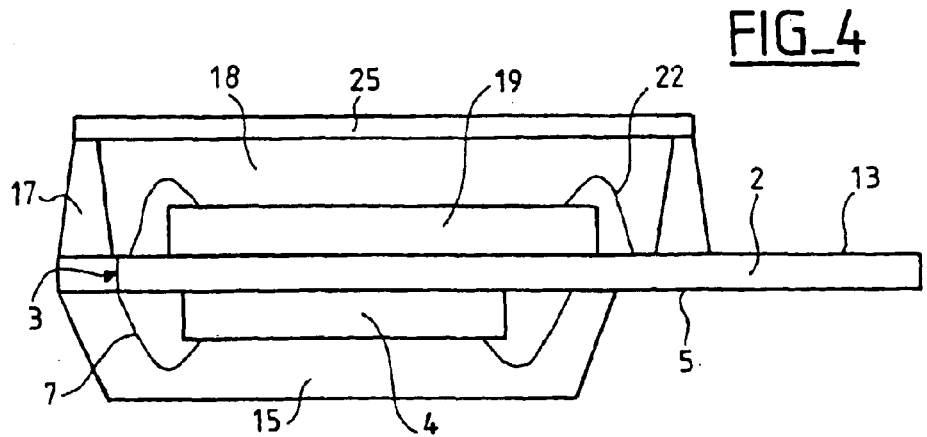

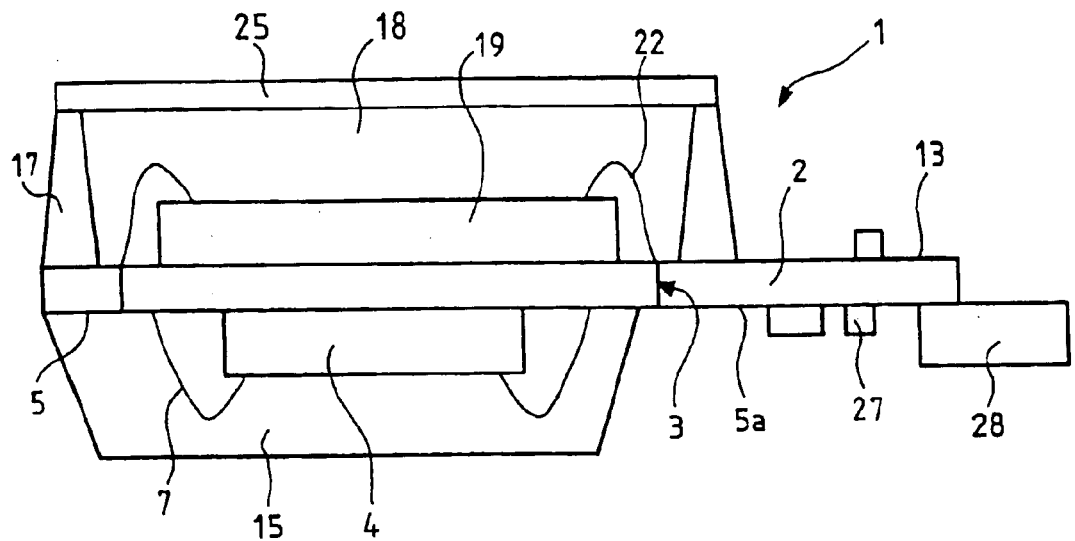
FIG_5
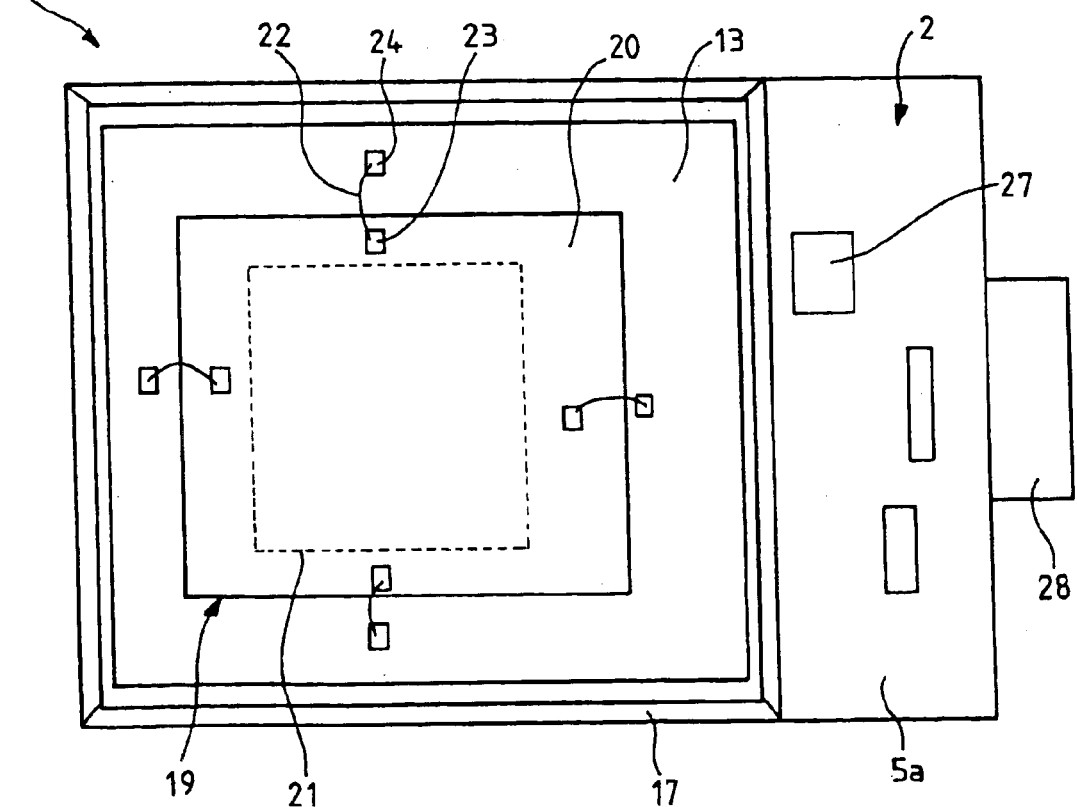
FIG_6

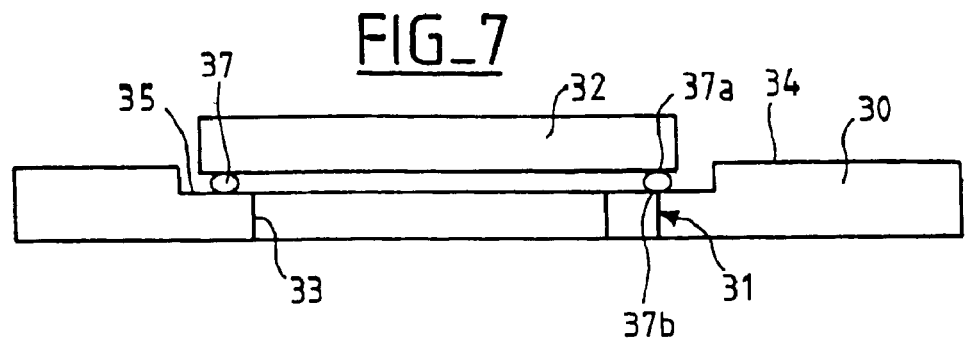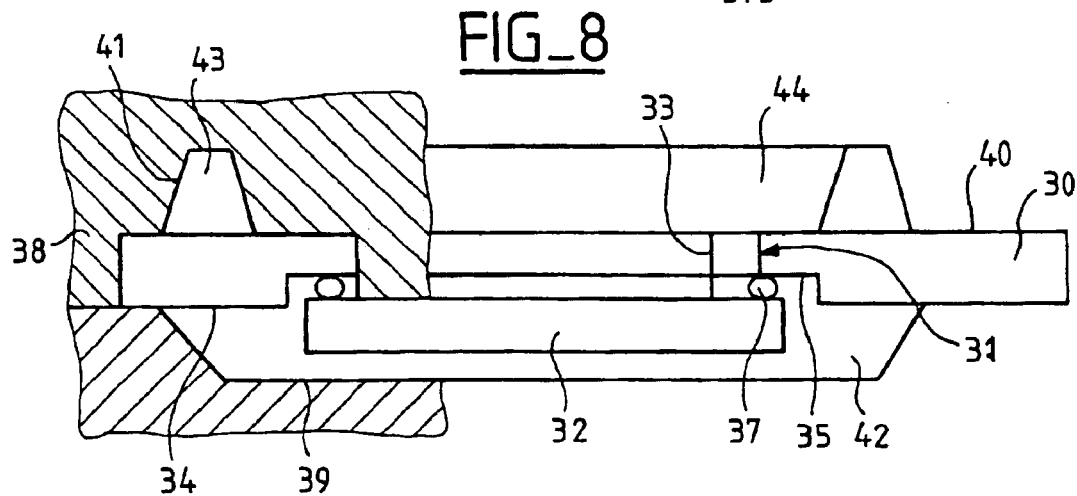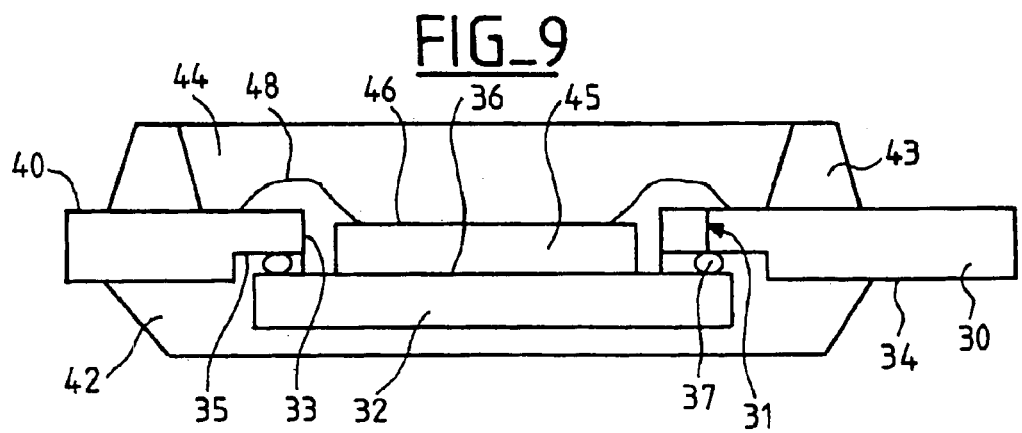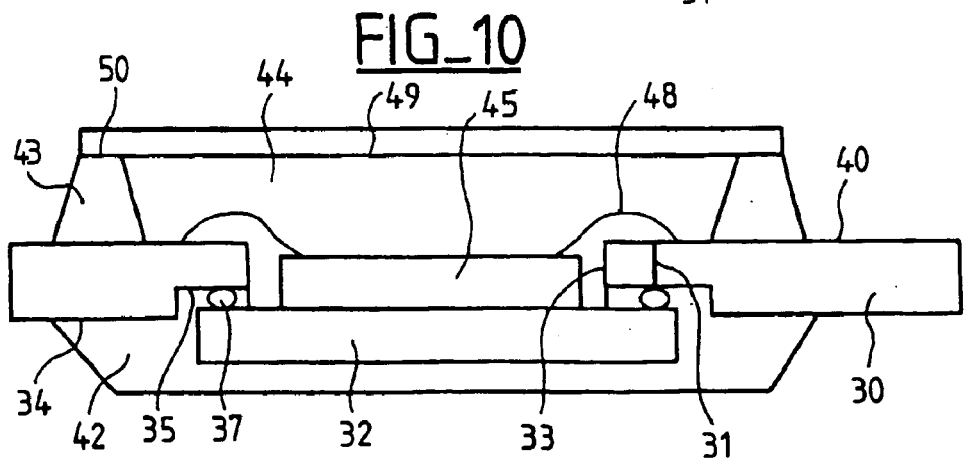

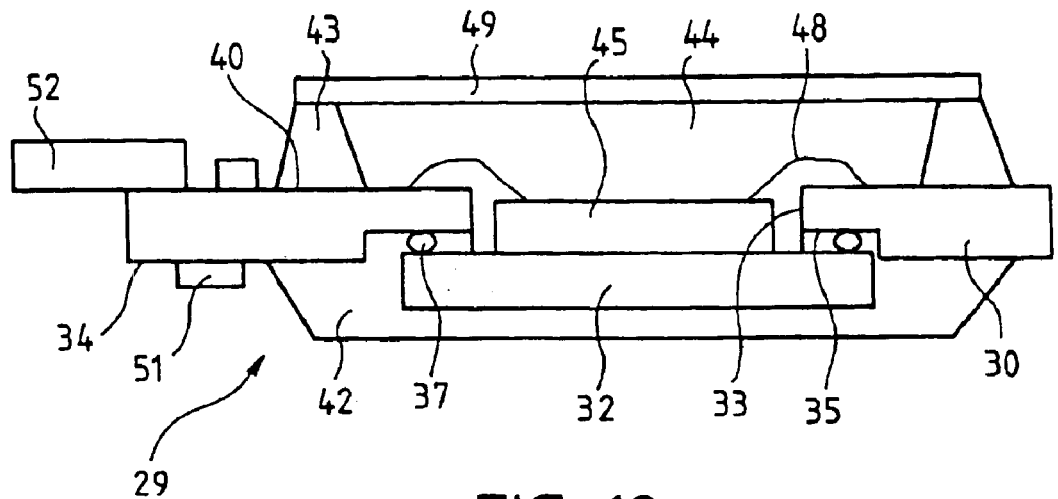
FIG_11
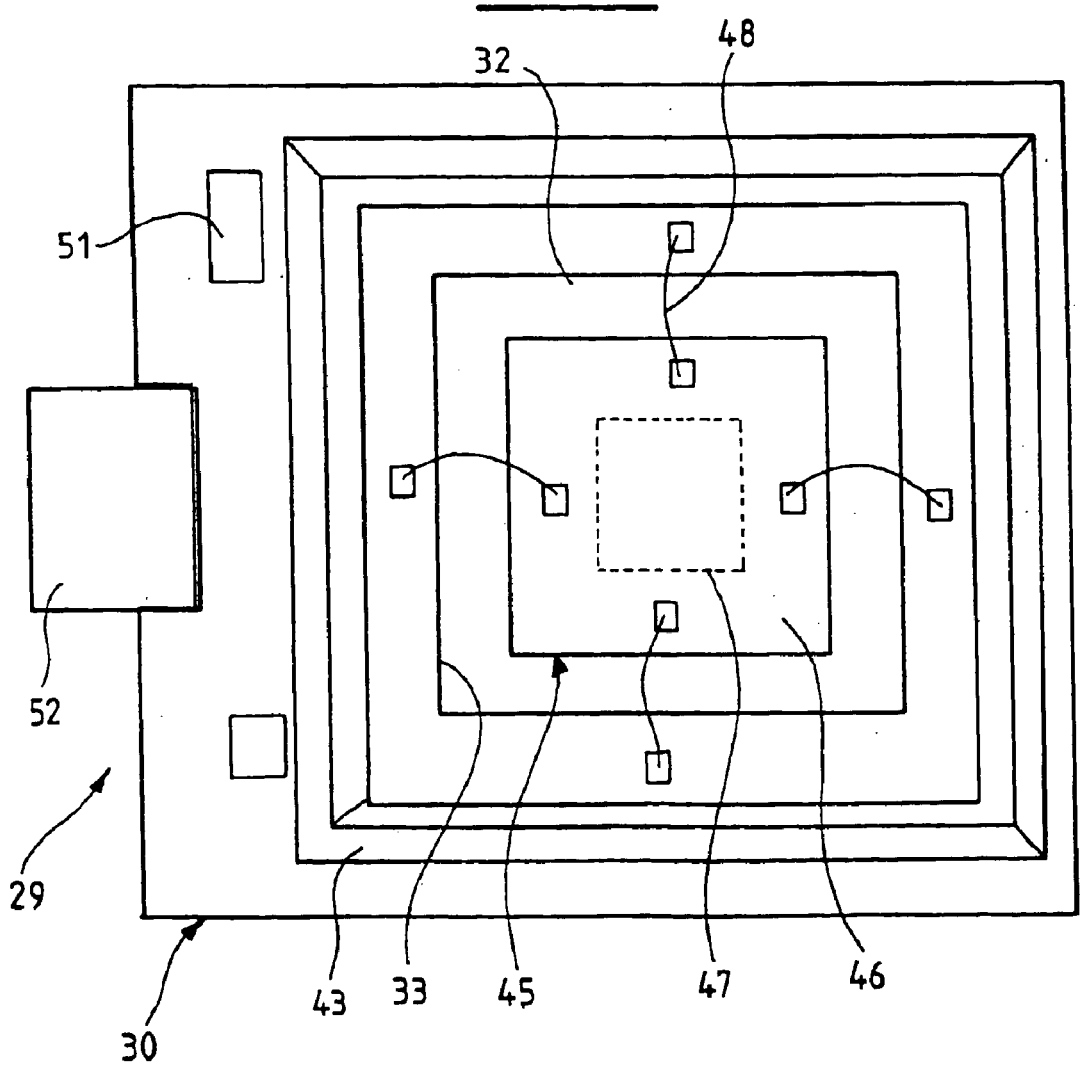
FIG_12

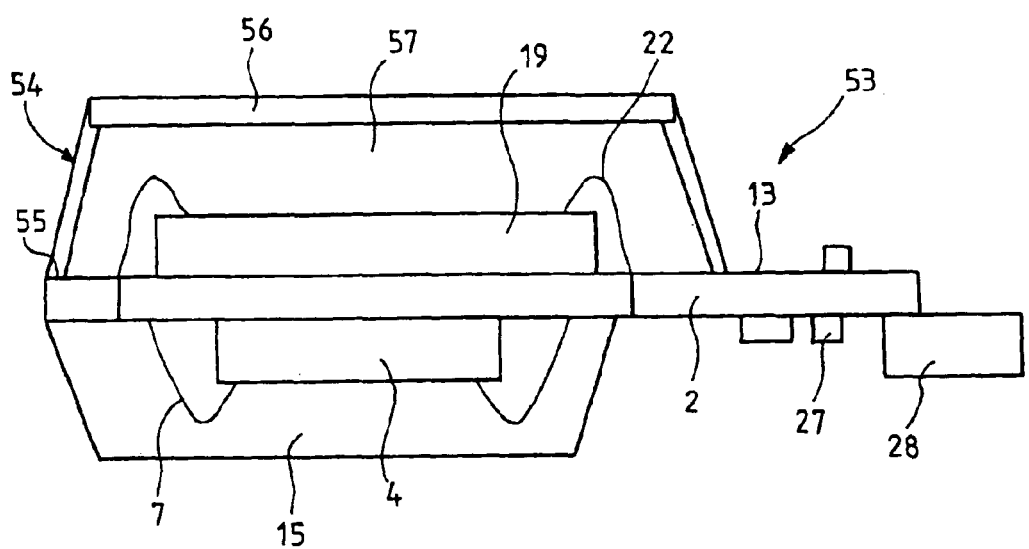
FIG_13

OPTICAL SEMICONDUCTOR PACKAGE AND PROCESS FOR FABRICATING THE SAME

FIELD OF THE INVENTION

The present invention relates to an optical semiconductor package and to a process for fabricating such a package.

SUMMARY OF THE INVENTION

The object of the present invention is to provide a structure for an optical semiconductor package comprising several semiconductor components and a process for fabricating such a package in such a way that this package has a small size and is capable of being used immediately, preferably to deliver image data from the data arising from a semiconductor component with an optical sensor.

According to one subject of the invention, the process for fabricating an optical semiconductor package includes, successively: fixing a first semiconductor component such as a microprocessor to a rear face of an electrical connection support plate and electrically connecting this first component to the said support plate; molding an encapsulation block for the said first component on the rear face of the said support plate; fixing a second semiconductor component, a front face of which has an optical sensor, via the front face of the said plate and electrically connecting this second component to the said support plate; and encapsulating the said second component on the front face of the said support plate.

According to an alternative embodiment of the invention, the process may include: molding an encapsulation block for the said first component on the rear face of the said support plate and molding the projecting wall of a cavity on the front face of the said support plate; fixing a second semiconductor component, a front face of which has an optical sensor, to the bottom of the said cavity and electrically connecting this second component to the said support plate; and closing the said cavity by a lid which is at least partially transparent.

According to another alternative embodiment of the invention, the process may include encapsulating the said second component on the front face of the said support plate using a dish-shaped lid.

According to an alternative embodiment of the invention, the process includes fixing the said second component to the front face of the said support plate.

According to another alternative embodiment of the invention, the process includes fixing the said second component to the front face of the said first component, through a passage in the said support plate.

According to the invention, the process may advantageously include electrically connecting the said first component to the said support plate by wires.

According to the invention, the process may advantageously include electrically connecting the said second component to the said support plate by wires.

According to the invention, the process may advantageously including fixing and electrically connecting an external electrical connection body to an exposed part of the said support plate.

According to the invention, the process may advantageously include fixing and electrically connecting external electrical connection balls to an exposed part of the said support plate.

According to the invention, the process may advantageously include fixing and electrically connecting at least one passive component to the said support plate.

According to another subject of the invention, the optical semiconductor package comprises: an electrical connection support plate; a first semiconductor component such as a microprocessor, a front face of which is fixed to a rear face of the said support plate; first means for electrical connection of the said first component to the said support plate; a second semiconductor component, a front face of which has an optical sensor and a rear face of which is carried by the said support plate; second means for electrical connection of the said second component to the said support plate; an encapsulation block for the said first component on the rear face of the said support plate; an encapsulation cavity at the bottom of which the second component is located and the wall of which is at least partially transparent; and external connection means located on an exposed part of the said support plate.

According to the invention, the wall of the said cavity may advantageously comprise an encapsulation wall projecting from the front face of the said support plate and a lid fixed to the front end of the said projecting wall, the said lid being at least partially transparent.

According to one embodiment, the wall of the said cavity may advantageously comprise a dish-shaped lid.

According to the invention, the said components are preferably fixed with an adhesive.

According to the invention, the package may comprise at least one passive component located on the said support plate.

According to the invention, the said first electrical connection means may comprise wires.

According to the invention, the said first electrical connection means may comprise metal balls.

According to the invention, the said second electrical connection means may comprise wires.

According to the invention, the said support plate may comprise a hollow part, to the bottom of which the said first component is fixed.

According to the invention, the said support plate may comprise a hollow part, to the bottom of which the said second component is fixed.

According to the invention, the rear face of the said second element may advantageously be fixed either directly to the front face of the said support plate or to the front face of the said first element through a passage passing through the said support plate.

BRIEF DESCRIPTION OF THE DRAWINGS

The present invention will be better understood by studying optical semiconductor packages and their fabrication processes, described by way of non-limiting examples and illustrated by the drawings in which:

FIG. 1 shows a side view of a first stage in the fabrication of a first package according to the present invention;

FIG. 2 shows a second stage in the fabrication of the said package;

FIG. 3 shows a third stage in the fabrication of the said first package according to a first embodiment of the latter;

FIG. 4 shows a fourth stage in the fabrication of the said first package;

FIG. 5 shows a fifth and final stage in the fabrication of the said first package;

FIG. 6 shows a top view of the said first package according to FIG. 5;

FIG. 7 shows a side view of a first stage in the fabrication of a second package according to the present invention;

FIG. 8 shows a second stage in the fabrication of the said second package;

FIG. 9 shows a third stage in the fabrication of the said second package according to a first embodiment of the latter;

FIG. 10 shows a fourth stage in the fabrication of the said second package;

FIG. 11 shows a fifth and final stage in the fabrication of the said second package;

FIG. 12 shows a top view of the said second package according to FIG. 11; and

FIG. 13 shows an alternative embodiment of the aforementioned packages.

DETAILED DESCRIPTION OF PREFERRED EMBODIMENTS

With reference to FIGS. 1 to 6, the various stages in the fabrication of an optical semiconductor package, denoted overall by reference number 1 and shown complete in FIGS. 5 and 6, will firstly be described.

FIG. 1 shows a prefabricated substrate 2 made up of a support plate which has internal and/or external lines forming a circuit 3 of electrical connections and a first semiconductor component 4 such as a microprocessor or coprocessor.

In a first fabrication stage, a front face 5 of the first component 4 is fixed flat to a rear face 6 of the support plate 2, via a layer of adhesive or any other means. Then, one of the ends of the wires 7 is fixed to the metal pads 8 formed on the surface on the rear face 9 of the component 4 and the other end of the connection wires 7 is fixed to the metal pads 10 of the circuit 3, these being formed on the surface of the rear face 6 of the support plate 2 and away from the periphery of the component 4.

In a second fabrication stage shown in FIG. 2, the support plate 2 and the component 4 of FIG. 1 are fitted such that they are set in a mold 11 which has, on the side of the rear face 5 of the plate 2, a cavity 12 in which the component 4 and the electrical connection wires 7 lie and, on the side of the front face 13 of the support plate 2, an annular cavity 14.

Encapsulation material is then injected into the cavities 12 and 14 of the mold 11 in order, on one hand, to encapsulate the component 4 and the electrical connection wires 7 in a block 15 and, on the other hand, to create an annular wall 17 which defines a cavity 18 on the side of the front face 13 of the support plate 2. Demolding then takes place.

In a third fabrication stage shown in FIG. 3, the rear face of a second semiconductor component 19 is fixed, via a layer of adhesive or any other means, to the front face 13 of the support plate 2 and in the center of the bottom of the cavity 18, the front face 20 of the component 19 having an optical sensor 12 in its central part.

The optical component 19 is then electrically connected to the electrical connection circuit 3 of the support plate 2 by fixing one of the ends of the electrical connection wires 22 to metal pads 23 formed on the surface of the front face 20 of the optical component 19 around the optical sensor 21 and by fixing the other end of the electrical connection wires 22 to metal pads 24 of the circuit 3, these being formed on the surface of the front face 13 of the support plate 2 and inside the periphery of the optical component 19 and the projecting wall 17.

In a fourth fabrication stage shown in FIG. 4, the cavity 18 is closed using a transparent lid 25 of which the periphery is fixed to the end 26 of the molded projecting wall 17, the optical component 19 and the electrical connection wires 22 being thus encapsulated in the cavity 18 in front of the front face 13 of the support plate 2.

In a fifth fabrication stage shown on FIG. 5, passive electronic components 27, such as resistors and/or capacitors, are fixed on the exposed part 5a of the rear face 5 of the support plate 2, located laterally with respect to the encapsulation block 15, these electronic components 27 being at the same time electrically connected to the electrical connection circuit 3 of the support plate 2.

Furthermore, an external electrical connection body 28 is fixed and electrically connected to the edge of the exposed part 5a of the support plate 2. This body 28 may be replaced by depositing a number of spaced-out metal balls on the support plate 2.

In this way, as shown on FIGS. 5 and 6, a complete optical semiconductor package 1 is obtained, fitted with an optical semiconductor component 19 and various electronic processing components 4 and 27, electrically connected in an appropriate way via the electrical connection circuit 3 of the support plate 1 and capable of being connected to an external circuit using the electrical connector 28 or metal balls or metal regions with equivalent surface areas.

The various fabrication stages of another optical semiconductor package denoted overall by reference number 29 and shown complete in FIGS. 11 and 12 will now be described with reference to FIGS. 7 to 12.

FIG. 7 shows a prefabricated substrate 30 made up of a support plate which has internal and/or external lines forming a circuit 31 of electrical connections and a first semiconductor component 32 such as a microprocessor or coprocessor, the support plate 30 having a through-passage 33 around which the rear face 34 of the support plate 30 has an annular hollow or countersink 35.

In a first fabrication stage, the front face 36 of the component 32 is fixed and electrically connected to the bottom of the annular hollow 35 via a number of distributed metal balls 37 which are inserted between metal connection pads 37a and 37b made on the surface, on one hand, of the front face 36 of the component 32 and, on the other hand, at the bottom of the hollow 35. In this assembled position, the component 32 penetrates slightly into the hollow 35.

In a second fabrication stage shown in FIG. 8, the support plate 30 and the component 32 of FIG. 1 are fitted so that they are mounted in a mold 38 which has, on the side of the rear face 34 of the support plate 30, a cavity 39 in which the component 32 lies and, on the side of the front face 40 of the support plate 30, an annular cavity 41. The mold 38 has a part 38a which is engaged into the through-passage 33 in the support plate 30 and which comes into contact with the front face 36 of the component 32 so as to obstruct the passage between the support plate 30 and the component 32 in which the metal balls 37 are located.

Encapsulation material is then injected into the cavities 39 and 41 of the mold 38 so as, on one hand, to encapsulate the component 32 and the electrical connection balls 37 in a block 42 and, on the other hand, to create a projecting annular wall 43. This projecting wall 43 defines a cavity 44 on the side of the front face 40 of the support plate 30, the said cavity having a depth which extends as far as the front face 36 of the component 32. Demolding then takes place.

In a third fabrication stage shown in FIG. 9, the rear face of a second semiconductor component 19 is fixed, via a layer of adhesive or any other means, to the front face 36 of the component 32 and in the center of the bottom of the cavity 44, the front face 46 of the component 19 having, as in the previous example, an optical sensor 47 in its central part.

Then, as in the previous example, the front face 46 of the optical component 45 is electrically connected to the electrical connection circuit 31 of the support plate 30 by electrical connection wires 48.

In a fourth fabrication stage shown in FIG. 10, as in the previous example, the cavity 44 is closed using a transparent lid 49 of which the periphery is fixed to the end 50 of the molded projecting wall 43 so as to encapsulate the optical component 45 and the connection wires 48 in the cavity 44.

In a fifth fabrication stage shown in FIG. 11, as in the previous example, passive electronic components 51 and an external electric connection body 52 or a number of spaced-out metal balls for external electric connection are fixed to the exposed part of the support plate 30 and connected to the circuit 31.

FIG. 13 shows a package 53 which differs from the packages 1 described with reference to FIGS. 1 to 6 in that only the encapsulating block 15 is molded and that the projecting part 17 and the lid 25 are replaced with a dish-shaped lid 54, whose peripheral edge is adhesively bonded to the front face 13 of the support plate and whose bottom 56 lies some distance away from the component 19, so as to define an encapsulating cavity 57, this bottom 56 being transparent. The same arrangement could be applied to the package 29 described with reference to FIGS. 7 to 12.

According to other embodiments, it would be possible to integrate the passive electronic components into the aforementioned molded blocks or to fix them to the bottom of the said cavities.

The present invention is not limited to the examples described hereinbefore. Many variants are possible without departing from the framework defined by the appended claims.

What is claimed is:

1. A method for fabricating an optical semiconductor package, said method comprising the steps of:
   providing an electrical connection support plate having a passage that passes through the support plate;
   fixing a periphery of a front face of a first semiconductor component to a rear face of the electrical connection support plate such that the first semiconductor component covers the passage in the support plate;
   electrically connecting the first semiconductor component to the rear face of the support plate;
   molding an encapsulation block for the first semiconductor component on the rear face of the support plate;
   fixing a rear face of a second semiconductor component directly to the front face of the first semiconductor component such that the second semiconductor component passes through the passage in the support plate, the second semiconductor component having a front face with an optical sensor;
   electrically connecting the second semiconductor component to a front face of the support plate; and
   providing an encapsulation for the second semiconductor component on the front face of the support plate, the encapsulation for the second semiconductor component being at least partially transparent.

2. The method as defined in claim 1, wherein the first semiconductor component is a microprocessor.

3. The method as defined in claim 1, wherein the step of molding the encapsulation block for the first semiconductor component includes the sub-step of molding a projecting wall of a cavity on the front face of the support plate, and the step of providing the encapsulation for the second semiconductor component includes the sub-step of closing the cavity using a lid that is at least partially transparent.

4. The method as defined in claim 1, wherein in the step of providing the encapsulation for the second semiconductor component, the encapsulation for the second semiconductor component comprises a dish-shaped lid.

5. The method as defined in claim 1, wherein the step of electrically connecting the first semiconductor component is electrically connected to the support plate by wires.

6. The method as defined in claim 1, wherein the step of electrically connecting the second semiconductor component, the second component is electrically connected to the support plate by wires.

7. The method as defined in claim 1, wherein the steps of fixing the periphery of the front face of the first semiconductor component and electrically connecting the first semiconductor component are performed by fixing and electrically connecting the first semiconductor component to the support plate by placing electrical connection balls between the first semiconductor component and the support plate.

8. The method as defined in claim 1, further comprising the step of fixing and electrically connecting an external electrical connection body to an exposed portion of the support plate.

9. The method as defined in claim 1, further comprising the step of fixing and electrically connecting at least one passive component to the support plate.

10. The method as defined in claim 1, wherein in the step of fixing the rear face of the second semiconductor component, the second component passes through the passage in the support plate without directly contacting the support plate.

11. An optical semiconductor package comprising:
    an electrical connection support plate having a front face, a rear face, and a passage that passes through the support plate;
    a first semiconductor component having a front face, a periphery of the front face of the first semiconductor component being fixed to the rear face of the support plate such that the first component covers the passage in the support plate;
    first connectors electrically connecting the first semiconductor component to the rear face of the support plate;
    a second semiconductor component having a rear face that is fixed directly to the front face of the first semiconductor component such that the second semiconductor component passes through the passage in the support plate, the second semiconductor component having a front face with an optical sensor;
    second components electrically connecting the second semiconductor component to the front face of the support plate;
    an encapsulation block for the first semiconductor component provided on the rear face of the support plate; and
    an encapsulation for the second semiconductor component provided on the front face of the support plate, the encapsulation for the second semiconductor component being at least partially transparent.

12. The semiconductor package as defined in claim 11, wherein the encapsulation for the second semiconductor component includes an encapsulation wall that projects from the front face of the support plate and a lid that is fixed to an end of the projecting wall, the lid being at least partially transparent.

13. The semiconductor package as defined in claim 11, wherein the encapsulation for the second semiconductor component includes a dish-shaped lid that is fixed to the front face of the support plate.

14. The semiconductor package as defined in claim 11, further comprising at least one passive component fixed to the support plate.

15. The semiconductor package as defined in claim 11, wherein the first connectors include wires.

16. The semiconductor package as defined in claim 11, wherein the first connectors include metal balls.

17. The semiconductor package as defined in claim 11, wherein the second connectors include wires.

18. The semiconductor package as defined in claim 11, wherein the support plate includes a hollow portion, the periphery of the front face of the first semiconductor component being fixed to the bottom of the hollow portion.

19. The semiconductor package as defined in claim 11, wherein the first semiconductor component is a microprocessor.

20. The semiconductor package as defined in claim 11, wherein the second semiconductor component passes through the passage in the support plate without directly contacting the support plate.

21. The semiconductor package as defined in claim 11, further comprising external connectors located on an exposed portion of the support plate.

22. The semiconductor package as defined in claim 11, wherein the second semiconductor component is an optical semiconductor component.

23. An information processing system comprising at least one optical semiconductor package, the optical semiconductor package including:

an electrical connection support plate having a front face, a rear face, and a passage that passes through the support plate;

a first semiconductor component having a front face, a periphery of the front face of the first semiconductor component being fixed to the rear face of the support plate such that the first semiconductor component covers the passage in the support plate;

first connectors electrically connecting the first semiconductor component to the rear face of the support plate;

a second semiconductor component having a rear face that is fixed directly to the front face of the first semiconductor component such that the second semiconductor component passes through the passage in the support plate, the second semiconductor component having a front face with an optical sensor;

second components electrically connecting the second semiconductor component to the front face of the support plate;

an encapsulation block for the first semiconductor component provided on the rear face of the support plate; and an encapsulation for the second semiconductor component provided on the front face of the support plate, the encapsulation for the second semiconductor component being at least partially transparent.

24. The information processing system as defined in claim 23, wherein the encapsulation for the second semiconductor component includes an encapsulation wall that projects from the front face of the support plate and a lid that is fixed to an end of the projecting wall, the lid being at least partially transparent.

25. The information processing system as defined in claim 23, wherein the encapsulation for the second semiconductor component includes a dish-shaped lid that is fixed to the front face of the support plate.

26. The information processing system as defined in claim 23, wherein the optical semiconductor package further includes at least one passive component fixed to the support plate.

* * * * *

UNITED STATES PATENT AND TRADEMARK OFFICE
CERTIFICATE OF CORRECTION

PATENT NO. : 6,893,169 B1
DATED : May 17, 2005
INVENTOR(S) : Juan Exposito et al.

It is certified that error appears in the above-identified patent and that said Letters Patent is hereby corrected as shown below:

Column 6,
Line 9, change "the step" to -- in the step --.
Line 10, change "component is" to -- component, the first semiconductor component is --.
Line 52, change "components" to -- connectors --.

Column 8,
Line 12, change "components" to -- connectors --.

Signed and Sealed this

Twenty-fifth Day of October, 2005

JON W. DUDAS
*Director of the United States Patent and Trademark Office*